(12) United States Patent
Chen et al.

(10) Patent No.: US 10,785,892 B1
(45) Date of Patent: Sep. 22, 2020

(54) HEAT DISSIPATION SYSTEM AND COOLANT DISTRIBUTION MODULE THEREOF

(71) Applicant: AURAS Technology Co., Ltd., New Taipei (TW)

(72) Inventors: Chien-An Chen, New Taipei (TW); Chien-Yu Chen, New Taipei (TW); Mu-Shu Fan, New Taipei (TW); Shih-Chieh Kao, New Taipei (TW); Che-Chia Chang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/516,309

(22) Filed: Jul. 19, 2019

(30) Foreign Application Priority Data

May 27, 2019 (TW) .............................. 108118272 A

(51) Int. Cl.
*H05K 7/20* (2006.01)
*G06F 1/20* (2006.01)

(52) U.S. Cl.
CPC ......... *H05K 7/20272* (2013.01); *G06F 1/206* (2013.01); *H05K 7/20281* (2013.01); *G06F 1/20* (2013.01); *H05K 7/20254* (2013.01); *H05K 7/20263* (2013.01); *H05K 7/20772* (2013.01)

(58) Field of Classification Search
CPC .......................... H05K 7/20627–20645; H05K 7/20763–20781; H05K 7/20272
See application file for complete search history.

(56) References Cited

U.S. PATENT DOCUMENTS

| | | | | |
|---|---|---|---|---|
| 6,714,412 B1* | 3/2004 | Chu | ..................... | H05K 7/2079 165/104.33 |
| 7,318,322 B2* | 1/2008 | Ota | ..................... | H05K 7/20781 62/259.2 |
| 7,355,852 B2* | 4/2008 | Pfahnl | ..................... | G06F 1/20 165/104.33 |
| 8,035,972 B2* | 10/2011 | Ostwald | ............. | H05K 7/20781 165/80.4 |
| 9,215,832 B2* | 12/2015 | Chang | ................ | H05K 7/20781 |
| 9,795,064 B2* | 10/2017 | Aoki | .................. | H05K 7/20772 |
| 10,222,845 B1* | 3/2019 | Norton | ...................... | G06F 1/20 |

* cited by examiner

*Primary Examiner* — Zachary Pape
(74) *Attorney, Agent, or Firm* — WPAT, PC

(57) ABSTRACT

A heat dissipation system and a coolant distribution module for plural electronic components of an electronic computing device are provided. The heat dissipation system includes plural water-cooling heads, a heat dissipation device and the coolant distribution module. When a fluid medium flows through the heat dissipation device, the heat dissipation device exchanges heat with the fluid medium. The coolant distribution module is connected between the plural water-cooling heads and the heat dissipation device. The coolant distribution module includes a main body and a power module. The module main body includes a cooled fluid chamber. The cooled fluid chamber includes plural first outlets corresponding to the plural water-cooling heads. The power module is installed in the module main body. The power module drives the fluid medium to be outputted from the plural first outlets. Consequently, the fluid medium is transferred through a circulating loop.

10 Claims, 3 Drawing Sheets

HEAT DISSIPATION SYSTEM AND COOLANT DISTRIBUTION MODULE THEREOF

FIELD OF THE INVENTION

The present invention relates to a heat dissipation system, and more particularly to a heat dissipation system with a coolant distribution module and the coolant distribution module.

BACKGROUND OF THE INVENTION

With increasing development of science and technology, various electronic devices (or computers) such as notebook computers, desktop computers or network servers have become indispensable devices in daily lives of people. Generally, during the operation of the electronic device, the temperature of the electronic components within the electronic device gradually increases. The elevated temperature may result in damage of the electronic components. For solving these problems, the electronic device is usually equipped with a heat dissipating mechanism. The heat dissipating mechanism needs to be specially designed. In accordance with a conventional heat dissipating mechanism, a fan is used to produce airflow to cool the electronic component through convection, or a heat dissipating unit made of a special material is attached on the electronic component to reduce the temperature through thermal conduction. In addition, a water cooling mechanism is one of the effective and common heat dissipating mechanisms.

The operating principles of the water cooling mechanism will be described as follows. Generally, the water cooling mechanism uses liquid (e.g., water or coolant) as the cooling medium, and uses a continuously-running pump to flow the liquid within an applied system along a circulating loop. The liquid flows along sealed pipes. The pipes are distributed to the surfaces of the electronic components (e.g., the central processing unit). When the liquid with the lower temperature flows through the electronic component with the higher temperature, the liquid absorbs the heat from the electronic component to decrease the temperature of the electronic component. Then, through heat exchange, the heat is released from the pipes to the surroundings or another heat dissipating mechanism. Consequently, the temperature of the liquid is decreased. Then, the liquid flows back to the system and flows along the circulating loop to remove the heat.

For example, a rack coolant distribution unit (also abbreviated as Rack CDU) is one of the water cooling devices used in the server. By the rack coolant distribution unit, the cooling liquid is directly transmitted to plural cold plates of a server rack through plural pipes simultaneously. In addition, the flowrates of the coolant to be transmitted to the cold plates are adjusted, and thus the cooling liquid is evenly distributed to the cold plates. Consequently, the electronic components (e.g., a central processing unit) on the cold plates are cooled by the cooling liquid. After the cooling liquid is outputted from the rack coolant distribution unit, the cooling liquid is transmitted through the associated pumps, the sealed loops and the back-end heat exchange mechanisms. Consequently, the cooling liquid is continuously inputted into the server rack to remove the heat from the server rack.

Moreover, an external loop of the distribution device comprises a cooled liquid inlet and a heated liquid outlet. The external loop is extended to the outside of the serve rack and connected with the back-end cooling pipe. The cold plates are disposed in a vertical stack form. Each cold plate also comprises a cooled liquid inlet and a heated liquid outlet. Through a manifold device (within the server rack), the cooled liquid inlets of these cold plates are connected with each other in parallels and the heated liquid outlets of these cold plates are connected with each other in parallels.

However, the water cooling mechanism for the server still has some drawbacks. For example, the rack coolant distribution unit uses the external loop to exchange heat and uses the manifold to evenly distribute the cooling liquid to the cold plates. Under this circumstance, the volume of the overall heat dissipation system is very huge. That is, it is difficult to install the heat dissipation system in the narrow space within the electronic device (e.g., the personal computer host).

Therefore, there is a need of providing an improved heat dissipation system and an improved coolant distribution module in order to overcome the drawbacks of the conventional technologies.

SUMMARY OF THE INVENTION

For solving the drawbacks of the conventional technologies, the present invention provides a heat dissipation system with a coolant distribution module. The structure of the coolant distribution module is specially designed. Consequently, the heat dissipation system is suitably installed in the narrow space of an electronic computing device.

For solving the drawbacks of the conventional technologies, the present invention provides a coolant distribution module. The structure of the coolant distribution module is specially designed. Consequently, the coolant distribution module is suitably installed in the narrow space of an electronic computing device.

In accordance with an aspect of the present invention, a heat dissipation system for an electronic computing device is provided. The electronic computing device includes plural electronic components. The heat dissipation system includes plural water-cooling heads, a heat dissipation device and a coolant distribution module. The plural water-cooling heads correspond to the plural electronic components. When a fluid medium flows through the heat dissipation device, the heat dissipation device exchanges heat with the fluid medium. The coolant distribution module is connected between the plural water-cooling heads and the heat dissipation device. The coolant distribution module includes a module main body and a power module. The module main body includes a cooled fluid chamber. The cooled fluid chamber includes plural first outlets corresponding to the plural water-cooling heads. The plural first outlets are connected with the corresponding water-cooling heads. The power module is installed in the module main body. The power module drives the fluid medium to be outputted from the plural first outlets. Consequently, the fluid medium is transferred through a circulating loop, which is defined by the plural water-cooling heads, the heat dissipation device and the coolant distribution module collaboratively.

In an embodiment, the module main body further includes a fluid storage chamber, and the power module is disposed between the fluid storage chamber and the cooled fluid chamber. The fluid storage chamber has a first inlet. The fluid storage chamber and the cooled fluid chamber are in communication with each other. The fluid medium is driven by the power module. Consequently, the fluid medium is inputted into the fluid storage chamber through the first inlet and outputted from the cooled fluid chamber through the plural first outlets.

In an embodiment, the module main body further includes a heated fluid chamber, and the heated fluid chamber is not in communication with the cooled fluid chamber and the fluid storage chamber. The heated fluid chamber includes plural second inlets and a second outlet. The plural second inlets are connected with the corresponding water-cooling heads.

In an embodiment, the plural first outlets of the cooled fluid chamber are disposed along a first fiducial line, the plural second inlets of the heated fluid chamber are disposed along a second fiducial line, the cooled fluid chamber is extended along the first fiducial line, the heated fluid chamber is extended along the second fiducial line, and the cooled fluid chamber and the heated fluid chamber are disposed along a third fiducial line. The first fiducial line and the second fiducial line are in parallel with each other. The first fiducial line and the second fiducial line are perpendicular to the third fiducial line.

In an embodiment, each water-cooling head comprises a head inlet and a head outlet. The head inlet is in fluid communication with the corresponding first outlet of the plural first outlets. The head outlet is in fluid communication with the corresponding second inlet of the plural second inlets. After the fluid medium is outputted from the head outlet of the corresponding water-cooling head, the fluid medium is inputted into the heated fluid chamber through the corresponding second inlet. After the fluid medium is outputted from the cooled fluid chamber through the plural first outlets, the fluid medium is inputted into the water-cooling heads through the corresponding head inlets.

In an embodiment, the heat dissipation device comprises a fluid inlet and a fluid outlet. The fluid inlet is in fluid communication with the second outlet of the heated fluid chamber. The fluid outlet is in fluid communication with the first inlet of the fluid storage chamber. After the fluid medium is outputted from the second outlet of the heated fluid chamber, the fluid medium is inputted into the heat dissipation device through the fluid inlet. After the fluid medium is outputted from the heat dissipation device through the fluid outlet, the fluid medium is inputted into the fluid storage chamber through the first inlet.

In an embodiment, the power module comprises an output port, and the coolant distribution module further includes a flowrate control device. The flowrate control device is disposed between the output port of the power module and the plural first outlets. The flowrates of the fluid medium to be outputted from the plural first outlets are controlled by the flowrate control device.

In an embodiment, the flowrate control device includes a sensing element and a microcontroller. The sensing element senses a flowrate value of the fluid medium between the output port of the power module and the plural first outlets. The flowrates of the fluid medium from the plural first outlets are controlled by the microcontroller according to the flowrate value.

In an embodiment, the coolant distribution module further includes a thermal sensor between the output port of the power module and the plural first outlets. The thermal sensor senses a temperature value of the fluid medium between the output port of the power module and the plural first outlets.

In an embodiment, the electronic computing device is a personal computer host, and the plural electronic components are display cards that are disposed within the personal computer host.

In accordance with another aspect of the present invention, a coolant distribution module for a heat dissipation system is provided. The heat dissipation system is configured for removing heat from plural electronic components of an electronic computing device. The heat dissipation system includes a heat dissipation device and plural water-cooling heads corresponding to the plural electronic components. The coolant distribution module includes a module main body and a power module. The module main body is connected between the plural water-cooling heads and the heat dissipation device. The module main body includes a cooled fluid chamber. The cooled fluid chamber includes plural first outlets corresponding to the plural water-cooling heads. The power module is installed in the module main body. The power module drives the fluid medium to be outputted from the plural first outlets. Consequently, the fluid medium is transferred through a circulating loop, which is defined by the plural water-cooling heads, the heat dissipation device and the coolant distribution module collaboratively.

From the above descriptions, the present invention provides the heat dissipation system. The module main body of the coolant distribution module is an integral structure of the cooled fluid chamber, the fluid storage chamber and the heated fluid chamber. Consequently, the volume of the heat dissipation system is effectively reduced. The cooled fluid chamber comprises the plural first outlets. As the fluid medium is driven by the power module, the fluid medium is outputted from the plural outlets to the corresponding water-cooling heads. Consequently, the purpose of distributing the cooling liquid is achieved. Due to this structural design, the heat dissipation system of the present invention can be installed in the casing of the electronic computing device, which comprises the small space. In addition, the heat dissipation system of the present invention can remove the heat from the plural electronic components within the casing of the electronic computing device.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
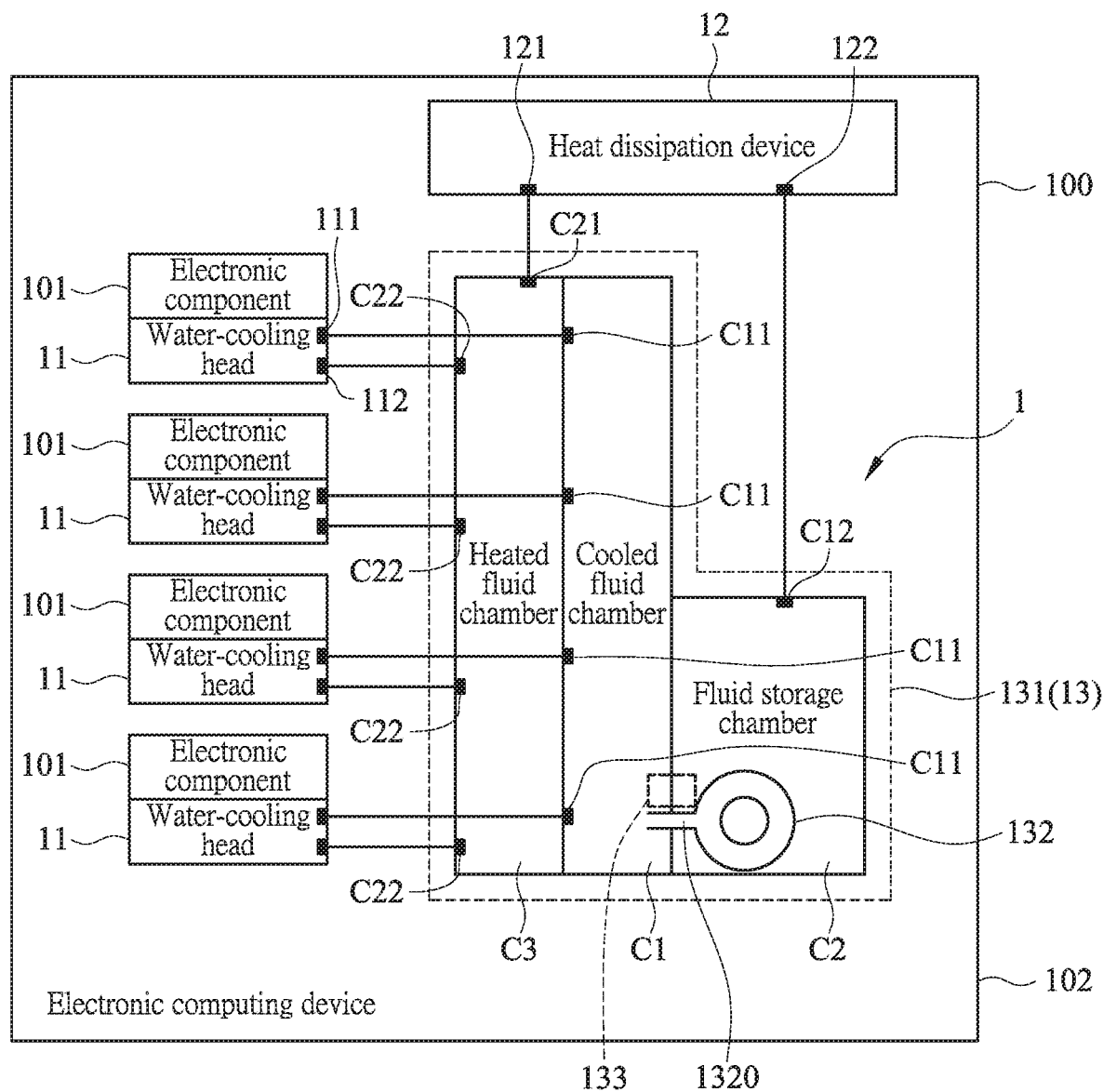
FIG. 1 is a schematic functional block diagram illustrating the architecture of a heat dissipation system according to an embodiment of the present invention.

For illustration, the structures, organizations or components of the heat dissipation system shown in the drawings of the present invention are not in scale with the elements of the practical product. According to the requirements of descriptions, the components may be scaled up or scaled down in an unequal proportion. The implementations of the heat dissipation system are not limited by the drawings.

Figure 2:
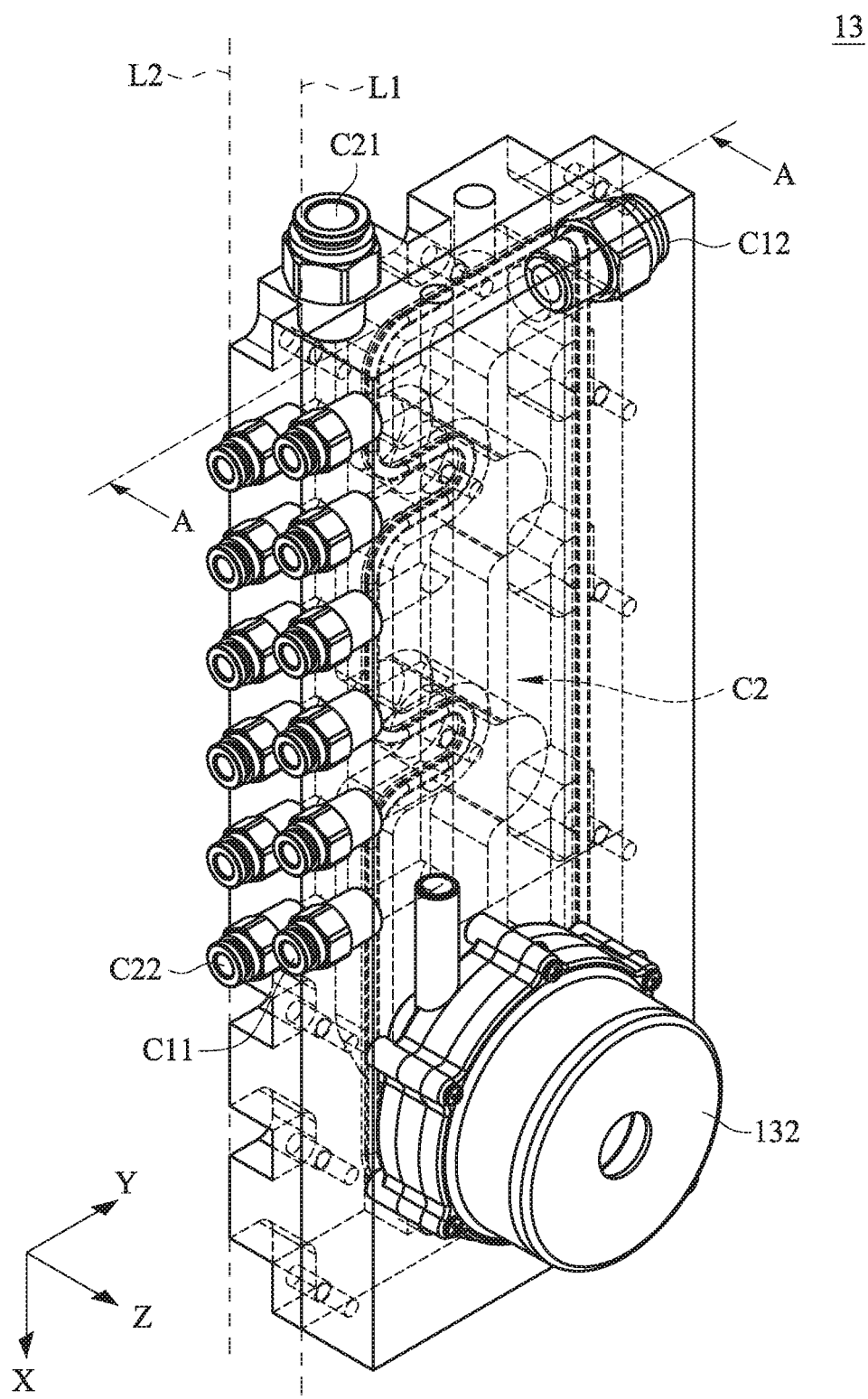
FIG. 2 is a schematic three-dimensional view illustrating the coolant distribution module of the heat dissipation system as shown in FIG. 1.
Figure 3:
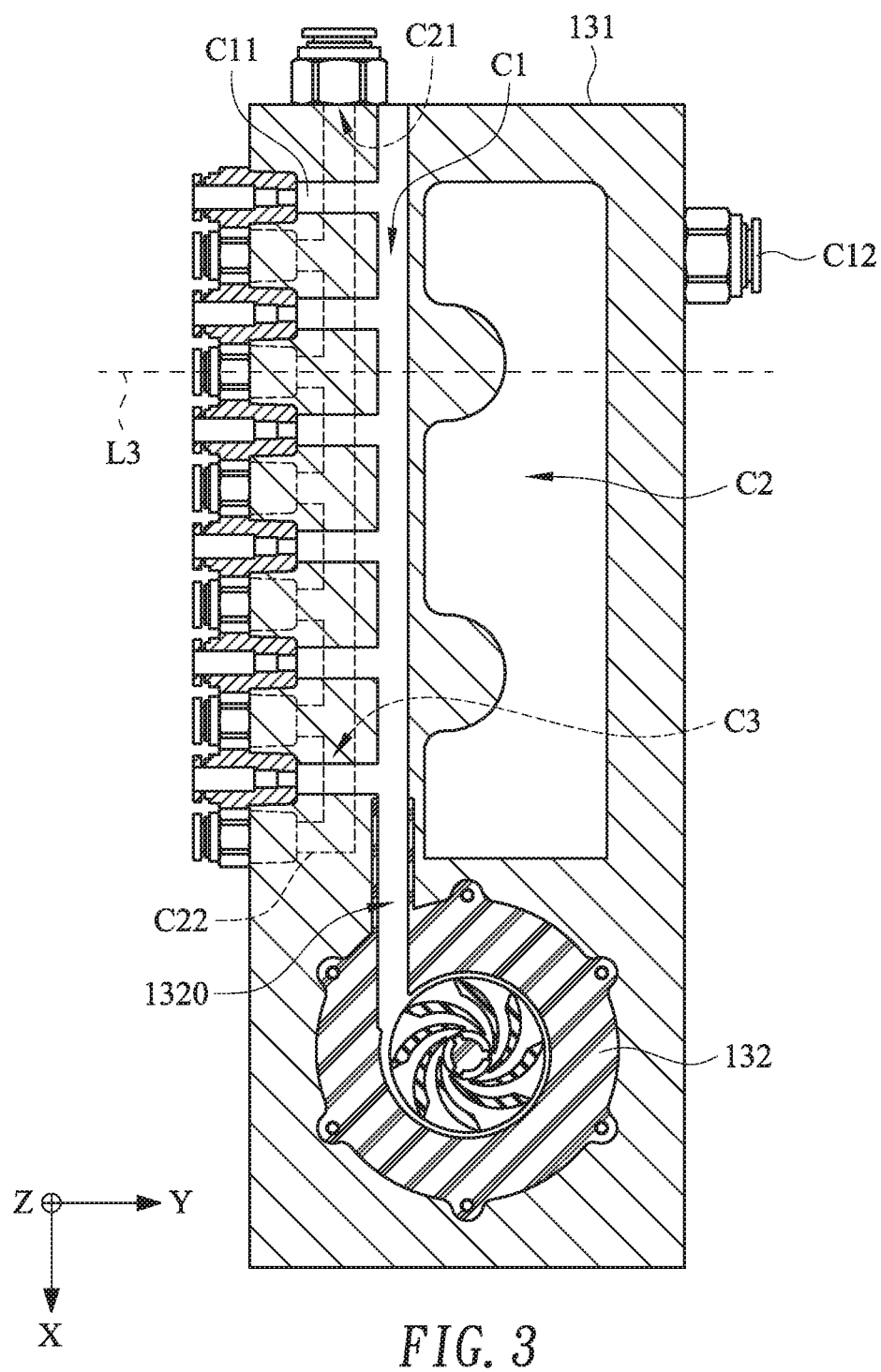
FIG. 3 is a schematic cross-sectional view illustrating the heat dissipation system as shown in FIG. 2 and taken along the line A-A.

Please refer to FIGS. 1, 2 and 3. FIG. 1 is a schematic functional block diagram illustrating the architecture of a heat dissipation system according to an embodiment of the present invention. FIG. 2 is a schematic three-dimensional view illustrating the coolant distribution module of the heat dissipation system as shown in FIG. 1. FIG. 3 is a schematic cross-sectional view illustrating the heat dissipation system as shown in FIG. 2 and taken along the line A-A. For clearly illustrating the coolant distribution module 13, some components of FIG. 2 are shown in the perspective view. As shown in FIG. 1, the heat dissipation system 1 is applied to plural electronic components 101 of an electronic computing device 100. For example, the electronic computing device 100 is a personal computer host, and the electronic components 101 are display cards within a casing 102 of the personal computer host. In other words, the heat dissipation system 1 is installed within the casing 102 of the personal computer host. During operations of the heat dissipation system 1, the generated heat is transferred to the low-temperature site. Consequently, the cooling efficacy is achieved.

As shown in FIG. 1, the heat dissipation system 1 comprises plural water-cooling heads 11, a heat dissipation device 12 and the coolant distribution module 13. These water-cooling heads 11 cooperate with the corresponding electronic components 101 (e.g., display cards) within the casing 102. The plural water-cooling heads 11 are in contact with the corresponding electronic components 101, respectively. It is noted that the way of establishing the connection between each water-cooling head 11 and the corresponding electronic component 101 is not restricted. That is, the way of establishing the connection between each water-cooling head 11 and the corresponding electronic component 101 may be varied according to the practical requirements. For example, in an embodiment, each water-cooling head 11 and the corresponding electronic component 101 are disposed within the same housing.

When a fluid medium (not shown) is transferred through the heat dissipation device 12, the radiator performs heat exchange on the fluid medium.

The coolant distribution module 13 is connected between these water-cooling heads 11 and the heat dissipation device 12.

Please refer to FIGS. 1, 2 and 3 again. The coolant distribution module 13 comprises a module main body 131 and a power module 132. The module main body 131 comprises a cooled fluid chamber C1. The cooled fluid chamber C1 comprises plural first outlets C11 corresponding to the plural water-cooling heads 11. The power module 132 is disposed within the module main body 131. The power module 132 is used for driving the fluid medium to be outputted from the plural first outlets C11. Consequently, the fluid medium is transferred through a circulating loop, which is defined by the water-cooling heads 11, the heat dissipation device 12 and the coolant distribution module 13 collaboratively. An example of the power module 132 includes but is not limited to a pump.

Please refer to FIGS. 1, 2 and 3 again. The module main body 131 comprises a fluid storage chamber C2. The power module 132 is disposed between the fluid storage chamber C2 and the cooled fluid chamber C1. The fluid storage chamber C2 comprises a first inlet C12. The fluid storage chamber C2 and the cooled fluid chamber C1 are in communication with each other. The fluid medium is driven by the power module 132. Consequently, the fluid medium is inputted into the fluid storage chamber C2 through the first inlet C12 and outputted from the cooled fluid chamber C1 through the plural first outlets C11.

Please refer to FIGS. 1, 2 and 3 again. The module main body 131 further comprises a heated fluid chamber C3. The heated fluid chamber C3 is not in communication with the cooled fluid chamber C1 and the fluid storage chamber C2. That is, the cooled fluid chamber C1 and the heated fluid chamber C3 are two separate and independent compartments in the module main body 131. The heated fluid chamber C3 comprises a second outlet C21 and plural second inlets C22. The plural second inlets C22 are connected with the corresponding water-cooling heads 11, respectively.

Please refer to FIGS. 2 and 3. The plural first outlets C11 of the cooled fluid chamber C1 are disposed along a first fiducial line L1. The plural second inlets C22 of the heated fluid chamber C3 are disposed along a second fiducial line L2. The cooled fluid chamber C1 is extended along the first fiducial line L1. The heated fluid chamber C3 is extended along the second fiducial line L2. The cooled fluid chamber C1 and the heated fluid chamber C3 are disposed along a third fiducial line L3. The first fiducial line L1 and the second fiducial line L2 are in parallel with each other. The first fiducial line L1 and the second fiducial line L2 are perpendicular to the third fiducial line L3.

In the embodiment of FIG. 1, the heat dissipation device 12 is a condenser. The condenser is a heat exchanger for transforming gas or vapor into liquid so as to provide cooling efficacy. In addition, the heat from the heat pipe (not shown) of the condenser can be quickly radiated to the ambient air of the heat dissipation device 12. Consequently, the heat is dissipated away. It is noted that the example of the heat dissipation device 12 is not restricted. In another embodiment, the heat dissipation device 12 is a water-cooling radiator. The heat dissipation device 12 comprises a fluid inlet 121 and a fluid outlet 122. The fluid inlet 121 is in fluid communication with the second outlet C21 of the heated fluid chamber C3. The fluid outlet 122 is in fluid communication with the first inlet C12 of the fluid storage chamber C2. After the fluid medium is outputted from the second outlet C21 of the heated fluid chamber C3, the fluid medium is inputted into the heat dissipation device 12 through the fluid inlet 121. The fluid medium is outputted from the heat dissipation device 12 through the fluid outlet 122. Then, the fluid medium is inputted into the fluid storage chamber C2 through the first inlet C12.

As shown in FIG. 1, each water-cooling head 11 comprises a head inlet 111 and a head outlet 112. The head inlet 111 of each water-cooling head 11 is in fluid communication with the corresponding first outlet C11 of the cooled fluid chamber C1. The head outlet 112 of each water-cooling head 11 is in fluid communication with the corresponding second inlet C22 of the heated fluid chamber C3. After the fluid medium is outputted from the water-cooling heads 11 through the head outlets 112 of the water-cooling heads 11, the fluid medium is inputted into the heated fluid chamber C3 through the corresponding second inlets C22. The fluid medium is outputted from the cooled fluid chamber C1 through the first outlets C11. Then, the fluid medium is inputted into the water-cooling heads 11 through the corresponding head inlets 111.

In an embodiment, the diameters of the plural first outlets C11 of the cooled fluid chamber C1 are identical, and the diameters of the plural head inlets 111 of the water-cooling heads 11 are identical. It is noted that numerous modifications and alterations may be made while retaining the teachings of the invention. In another embodiment, the diameters of the plural first outlets C11 and the diameters of the plural head inlets 111 are determined according to the thermal resistance values of the corresponding water-cooling heads 11. For example, in case that the water-cooling head 11 comprises the higher thermal resistance value, the diameters of the corresponding first outlet C11 and the corresponding head inlet 111 are larger. Whereas, in case that the water-cooling head 11 comprises the lower thermal resistance value, the diameters of the corresponding first outlet C11 and the corresponding head inlet 111 are smaller. Due to this design, all of the water-cooling heads 11 have the good heat dissipating efficiency. In other words, the diameters of the first outlets C11 and the head inlets 111 in the heat dissipation system 1 may be different.

Preferably but not exclusively, the relationship of each fluid communication may be established through the connection of an associated conduit (not shown). Moreover, the fluid medium filled in the circulating loop is a liquid medium, a gaseous medium or the mixture of the liquid medium and the gaseous medium. The coolant distribution module 13 in the heat dissipation system 1 comprises the functions of connecting associated conduits, homogenizing the fluid medium and transferring the fluid medium. The coolant distribution module 13 is capable of evenly or intelligently transferring the fluid medium to the cold plates 1 through the plural first outlets C11 of the cooled fluid chamber C1 according to the practical requirements. Preferably but not exclusively, the coolant distribution module 13 is capable of monitoring the heat dissipating performance in real time and automatically adjusting the optimal heat dissipating performance.

The operations of the heat dissipation system 1 will be described as follows. When the fluid medium flows through the cold plates 11, the fluid medium is heated by the heat source of the electronic components 101 corresponding to the cold plates 11. After the heated fluid medium is outputted from the water-cooling heads 11 through the head outlets 112, the fluid medium is inputted into the heated fluid chamber C3 through the corresponding second inlets C22. After the fluid medium is outputted from the heated fluid chamber C3 through the second outlet C21 of the heated fluid chamber C3, the fluid medium is inputted into the radiator 12 through the fluid inlet 121. As mentioned above, the fluid medium flowing into the heat dissipation device 12 exchanges heat with the heat dissipation device 12, and thus the fluid medium is cooled down. After the fluid medium is cooled down by the heat dissipation device 12, the fluid medium is outputted from the heat dissipation device 12 through the fluid outlet 122. Then, the fluid medium is inputted into the fluid storage chamber C2 of the module main body 131 through the first inlet C12. After the fluid medium is inputted into the fluid storage chamber C2 through the first inlet C12, the fluid medium is driven by the power module 132 and outputted from the cooled fluid chamber C1 through the plural first outlets C11 of the cooled fluid chamber C1. Then, the fluid medium is transferred into the water-cooling heads 11 through the plural head inlets 111 again. The above steps are repeatedly done to circulate the fluid medium along the circulating loop. Since the heat of the plural electronic components 101 of the electronic computing device 100 is dissipated to the low-temperature site, the efficacy of reducing the temperature of the fluid medium is enhanced.

As shown in FIG. 1, the coolant distribution module 13 further comprises a flowrate control device 133. The flowrate control device 133 is disposed between an output port 1320 of the power module 132 and the plural first outlets C11 of the cooled fluid chamber C1. The flowrates of the fluid medium to be outputted from the plural first outlets C11 are controlled by the flowrate control device 133. In an embodiment, the flowrate control device 133 comprises a sensing element and a microcontroller (not shown). The sensing element is used for sensing a flowrate value of the fluid medium between the output port 1320 of the power module 132 and the plural first outlets C11 of the cooled fluid chamber C1. According to the flowrate value, the flowrates of the fluid medium from the plural first outlets C11 are controlled by the microcontroller. Preferably but not exclusively, the sensor is a flow meter. In some embodiments, a thermal sensor (not shown) is disposed between the output port 1320 of the power module 132 and the plural first outlets C11 of the cooled fluid chamber C1. The thermal sensor is used for sensing the temperature value of the fluid medium between the output port 1320 of the power module 132 and the plural first outlets C11.

From the above descriptions, the present invention provides the heat dissipation system. The module main body of the coolant distribution module is an integral structure of the cooled fluid chamber, the fluid storage chamber and the heated fluid chamber. Consequently, the volume of the heat dissipation system is effectively reduced. The cooled fluid chamber comprises the plural first outlets. As the fluid medium is driven by the power module, the fluid medium is outputted from the plural outlets to the corresponding water-cooling heads. Consequently, the purpose of distributing the cooling liquid is achieved. Due to this structural design, the heat dissipation system of the present invention can be installed in the casing of the electronic computing device (e.g., the personal computer host), which comprises the small space. In addition, the heat dissipation system of the present invention can remove the heat from the plural electronic components (e.g., display cards) within the casing of the electronic computing device.

While the invention comprises been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A heat dissipation system for an electronic computing device, the electronic computing device comprising plural electronic components, the heat dissipation system comprising:

plural water-cooling heads correspondingly disposed on the plural electronic components;

a heat dissipation device, wherein when a fluid medium flows through the heat dissipation device, the heat dissipation device exchanges heat with the fluid medium; and a coolant distribution module connected between the plural water-cooling heads and the heat dissipation device, wherein the coolant distribution module comprises:

a module main body comprising a cooled fluid chamber, wherein the cooled fluid chamber comprises plural first outlets corresponding to the plural water-cooling heads, wherein the plural first outlets are connected with the corresponding water-cooling heads;

a power module installed in the module main body and comprising an output port, wherein the power module drives the fluid medium to be outputted from the plural first outlets, so that the fluid medium is transferred through a circulating loop, which is defined by the plural water-cooling heads, the heat dissipation device and the coolant distribution module collaboratively; and a flowrate control device disposed between the output port of the power module and the plural first outlets, wherein flowrates of the fluid medium to be outputted from the plural first outlets are controlled by the flowrate control device.

2. The heat dissipation system according to claim 1, wherein the module main body further comprises a fluid storage chamber, and the power module is disposed between the fluid storage chamber and the cooled fluid chamber, wherein the fluid storage chamber comprises a first inlet, the fluid storage chamber and the cooled fluid chamber are in communication with each other, and the fluid medium is driven by the power module, so that the fluid medium is inputted into the fluid storage chamber through the first inlet and outputted from the cooled fluid chamber through the plural first outlets.

3. The heat dissipation system according to claim 2, wherein the module main body further comprises a heated fluid chamber, and the heated fluid chamber is not in communication with the cooled fluid chamber and the fluid storage chamber, wherein the heated fluid chamber comprises plural second inlets and a second outlet, and the plural second inlets are connected with the corresponding water-cooling heads.

4. The heat dissipation system according to claim 3, wherein the plural first outlets of the cooled fluid chamber are disposed along a first fiducial line, the plural second inlets of the heated fluid chamber are disposed along a second fiducial line, the cooled fluid chamber is extended along the first fiducial line, the heated fluid chamber is extended along the second fiducial line, and the cooled fluid chamber and the heated fluid chamber are disposed along a third fiducial line, wherein the first fiducial line and the second fiducial line are in parallel with each other, and the first fiducial line and the second fiducial line are perpendicular to the third fiducial line.

5. The heat dissipation system according to claim 3, wherein each water-cooling head comprises a head inlet and a head outlet, wherein the head inlet is in fluid communication with the corresponding first outlet of the plural first outlets, and the head outlet is in fluid communication with the corresponding second inlet of the plural second inlets, wherein after the fluid medium is outputted from the head outlet of the corresponding water-cooling head, the fluid medium is inputted into the heated fluid chamber through the corresponding second inlet, wherein after the fluid medium is outputted from the cooled fluid chamber through the plural first outlets, the fluid medium is inputted into the water-cooling heads through the corresponding head inlets.

6. The heat dissipation system according to claim 3, wherein the heat dissipation device comprises a fluid inlet and a fluid outlet, wherein the fluid inlet is in fluid communication with the second outlet of the heated fluid chamber, and the fluid outlet is in fluid communication with the first inlet of the fluid storage chamber, wherein after the fluid medium is outputted from the second outlet of the heated fluid chamber, the fluid medium is inputted into the heat dissipation device through the fluid inlet, wherein after the fluid medium is outputted from the heat dissipation device through the fluid outlet, the fluid medium is inputted into the fluid storage chamber through the first inlet.

7. The heat dissipation system according to claim 1, wherein the flowrate control device comprises a sensing element and a microcontroller, wherein the sensing element senses a flowrate value of the fluid medium between the output port of the power module and the plural first outlets, and flowrates of the fluid medium from the plural first outlets are controlled by the microcontroller according to the flowrate value.

8. The heat dissipation system according to claim 1, wherein the coolant distribution module further comprises a thermal sensor disposed between the output port of the power module and the plural first outlets, wherein the thermal sensor senses a temperature value of the fluid medium between the output port of the power module and the plural first outlets.

9. The heat dissipation system according to claim 1, wherein the electronic computing device is a personal computer host, and the plural electronic components are display cards that are disposed within the personal computer host.

10. A coolant distribution module for a heat dissipation system, the heat dissipation system being configured for removing heat from plural electronic components of an electronic computing device, the heat dissipation system comprising a heat dissipation device and plural water-cooling heads corresponding to the plural electronic components, the coolant distribution module comprising:

a module main body connected between the plural water-cooling heads and the heat dissipation device, and comprising a cooled fluid chamber, wherein the cooled fluid chamber comprises plural first outlets corresponding to the plural water-cooling heads;

a power module installed in the main body and comprising an output port, wherein the power module drives a fluid medium to be outputted from the plural first outlets, so that the fluid medium is transferred through a circulating loop, which is defined by the plural water-cooling heads, the heat dissipation device and the coolant distribution module collaboratively; and a flowrate control device disposed between the output port of the power module and the plural first outlets, and flowrates of the fluid medium to be outputted from the plural first outlets are controlled by the flowrate control device.

* * * * *